US012439771B2

(12) United States Patent
Park et al.

(10) Patent No.: US 12,439,771 B2
(45) Date of Patent: Oct. 7, 2025

(54) DISPLAY DEVICE AND METHOD OF PROVIDING THE SAME

(71) Applicant: Samsung Display Co., Ltd., Yongin-si (KR)

(72) Inventors: San Park, Incheon (KR); Gyutae Kim, Seoul (KR); Seong-Sik Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 556 days.

(21) Appl. No.: 17/749,284

(22) Filed: May 20, 2022

(65) Prior Publication Data
US 2023/0040833 A1 Feb. 9, 2023

(30) Foreign Application Priority Data
Aug. 9, 2021 (KR) .................. 10-2021-0104406

(51) Int. Cl.
H10K 50/86 (2023.01)
H10K 59/38 (2023.01)
H10K 59/40 (2023.01)
H10K 71/00 (2023.01)
H10K 102/00 (2023.01)

(52) U.S. Cl.
CPC .......... H10K 50/865 (2023.02); H10K 59/38 (2023.02); H10K 59/40 (2023.02); H10K 71/00 (2023.02); H10K 2102/311 (2023.02)

(58) Field of Classification Search
CPC .. G09F 9/301; H04M 1/0268; H10K 59/8791; H10K 59/8792; G06F 1/1652
See application file for complete search history.

(56) References Cited

U.S. PATENT DOCUMENTS

| 10,446,769 | B2 | 10/2019 | Kim et al. | |
| 10,910,589 | B2 | 2/2021 | Jeong et al. | |
| 11,177,458 | B2 | 11/2021 | Wang et al. | |
| 11,183,672 | B2 | 11/2021 | Park | |
| 11,380,878 | B2 | 7/2022 | Choi et al. | |
| 2018/0197933 | A1* | 7/2018 | Son | H10K 59/8791 |
| 2019/0165332 | A1* | 5/2019 | Kwon | H10K 50/15 |
| 2019/0373719 | A1* | 12/2019 | Lee | H10K 59/12 |
| 2020/0285338 | A1 | 9/2020 | Eom et al. | |
| 2020/0406397 | A1 | 12/2020 | Roh et al. | |
| 2021/0027667 | A1* | 1/2021 | Lee | H10K 50/86 |
| 2022/0039267 | A1* | 2/2022 | Kim | H10K 77/111 |

FOREIGN PATENT DOCUMENTS

| KR | 1020160093202 A | 8/2016 |
| KR | 20200104973 A | 9/2020 |
| KR | 1020200107014 A | 9/2020 |
| KR | 1020210000805 A | 1/2021 |
| KR | 20210018625 A | 2/2021 |
| KR | 20210019637 A | 2/2021 |

* cited by examiner

Primary Examiner — Mariceli Santiago
(74) Attorney, Agent, or Firm — CANTOR COLBURN LLP

(57) ABSTRACT

A display device includes a display panel having a first region, a second region, and a bending region which is between the first region and the second region and at which the display panel is bendable, an anti-reflection layer on the display panel and including a color filter, and a shock absorbing layer facing the display panel with the anti-reflection layer therebetween. The shock absorbing layer extends from the first region of the display panel and into the bending region thereof.

14 Claims, 10 Drawing Sheets

DISPLAY DEVICE AND METHOD OF PROVIDING THE SAME

This application claims priority to Korean Patent Application No. 10-2021-0104406, filed on Aug. 9, 2021, the entire contents of which are hereby incorporated by reference.

BACKGROUND

(1) Field

The present disclosure herein relates to a display device and a method of manufacturing (or providing) the same. More particularly, the present disclosure herein relates to a display device having a reduced dead space, and a simplified process of providing the display device, and a method of manufacturing (or providing) the display device.

(2) Description of the Related Art

A display device includes an active region activated in response to an electrical signal. A display device may detect an input applied from outside the display device, through the active region, and also display various images to provide information to outside the display device. As display devices having various shapes have been developed, active regions having various shapes are being achieved.

SUMMARY

The present disclosure provides a display device having a reduced dead space, a simplified process of providing the display device, and a method of manufacturing (or providing) the display device.

An embodiment provides a display device including a display panel including a first region, a second region, and a bending region which is between the first region and the second region and at which the display panel is bendable, an anti-reflection layer on the display panel and having a color filter, and a shock absorbing layer partially on the anti-reflection layer, where the shock absorbing layer overlaps the first region and the bending region of the display panel.

In an embodiment, the shock absorbing layer may include a polymer.

In an embodiment, the shock absorbing layer may have a thickness of about 50 micrometers ($\mu$m) to about 80 $\mu$m.

In an embodiment, the display device may further include a driving circuit in the second region of the display panel.

In an embodiment, the display device may further include a cover layer which covers the driving circuit and extends to partially overlap the shock absorbing layer.

In an embodiment, the display device may further include a protective pattern between the cover layer and the shock absorbing layer.

In an embodiment, the protective pattern may overlap the second region and may not overlap the bending region.

In an embodiment, the shock absorbing layer may overlap the second region.

In an embodiment, the shock absorbing layer may include a first portion overlapping the first region, a second portion overlapping the bending region, and the first portion and the second portion being integral with each other.

In an embodiment, in the bending region, the second portion may be in contact with an upper surface of the display panel.

In an embodiment, the display device may further include a window module on the shock absorbing layer. The window module may include a window base layer on the shock absorbing layer, and a window protective layer on the window base layer, where the shock absorbing layer may have a lower modulus value than the window protective layer.

In an embodiment, the first region may include a display region having a plurality of pixels, and a non-display region adjacent to the display region.

In an embodiment, the anti-reflection layer may further include a division layer between the plurality of color filters.

In an embodiment, the display device may further include an input sensor between the display panel and the anti-reflection layer.

In an embodiment, a display device includes a display panel including a first region, a second region, and a bending region which is between the first region and the second region and at which the display panel is bendable, a shock absorbing layer partially on the display panel and overlapping the first region and the bending region, a driving circuit in the second region, a cover layer which covers the driving circuit and extends to partially overlap the shock absorbing layer, and a protective pattern between the cover layer and the shock absorbing layer.

In an embodiment, the display device may further include an anti-reflection layer between the display panel and the shock absorbing layer and including a plurality of color filters and a division layer which is between the plurality of color filters.

In an embodiment, the display device includes a display panel having a first region, a bending region, and a second region sequentially arranged in one direction, and a driving circuit on the display panel and overlapping the second region. A method of providing the display device includes providing a shock absorbing layer to overlap the first region, the bending region and the second region, providing a protective film on the shock absorbing layer, providing a cover layer which covers the driving circuit and partially overlaps the protective film at the second region, providing a portion of the protective film removed to define a first protective portion of the protective film which overlaps the cover layer and a second protective portion of the protective film which does not overlap the cover layer, and providing the second protective portion of the protective film removed from the shock absorbing layer.

In an embodiment, the shock absorbing layer may include a first portion overlapping the first region, a second portion overlapping the bending region, and a third portion overlapping the second region. In the providing of the shock absorbing layer, the first portion, the second portion and the third portion are formed to be integral with each other.

In an embodiment, in the providing of the shock absorbing layer, the second portion may contact an upper surface of the display panel.

In an embodiment, in the providing of the protective film on the shock absorbing layer, the protective film may be on an entirety of the shock absorbing layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1A:
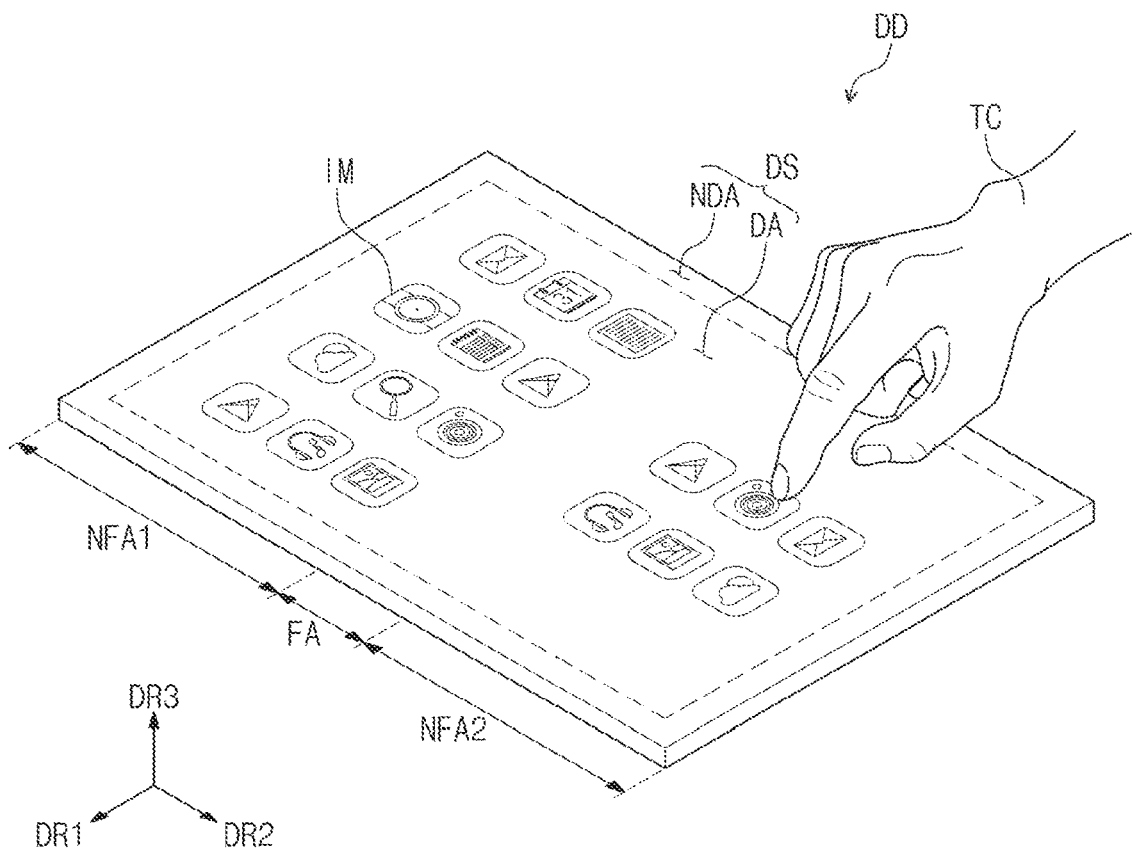
FIGS. 1A and 1B are perspective views of an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being related to another element such as being "on", "connected to" or "coupled to" another element or layer, it can be directly on, connected or coupled to the other element or layer or intervening elements or layers may be present. In contrast, when an element is referred to as being related to another element such as being "directly on," "directly connected to" or "directly coupled to" another element or layer, there are no intervening elements or layers present.

Like reference numerals or symbols refer to like elements throughout. The thickness and the ratio and the dimension of the element are exaggerated for effective description of the technical contents. As used herein, a reference number may indicate a singular element or a plurality of the element. For example, a reference number labeling a singular form of an element within the drawing figures may be used to reference a plurality of the singular element within the text of specification. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

As used herein, "directly disposed" may mean that there is no layer, film, region, plate, etc. added between a portion of a layer, film, region, plate, etc. and another portion. For example, "directly disposed" may mean disposing between two layers or two members without using an additional member such as an adhesive member.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
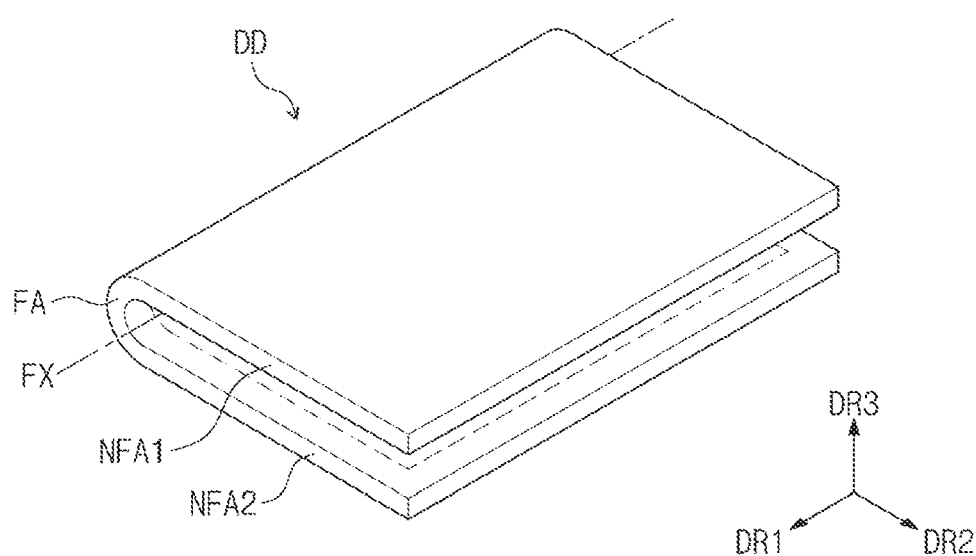

FIG. 1A is a perspective view of an embodiment of a display device DD. FIG. 1B is a perspective view of an embodiment of a display device DD. FIG. 1A illustrates an embodiment of the display device DD which is unfolded, and FIG. 1B illustrates an embodiment of the display device DD illustrated in FIG. 1A which is folded.

Referring to FIGS. 1A and 1B, the display device DD may be a foldable display device. The display device DD may be used in not only a large-sized electronic device such as televisions and monitors, but also a small- and mediumsized electronic device such as a mobile phone, a tablet computer, a car navigation system, a game machine, and a smart watch.

An upper surface of the display device DD may be defined as a display surface DS. In an unfolded state, that is, in a state in which the display device DD is flat, the display surface DS may have a plane (or be parallel to a plane) defined by a first direction DR1 and a second direction DR2 crossing each other. A thickness direction of the display device DD may be parallel to the third direction DR3 crossing each of the first direction DR1 and the second direction DR2. Accordingly, the front surface (or upper surface) and the rear surface (or lower surface) of each member constituting the display device DD may be defined with respect to the third direction DR3.

The display surface DS may include a display region DA and a non-display region NDA which is adjacent to the display region DA. The display region DA is a region in which an image IM is displayed, and the non-display region NDA is a region in which the image IM is not displayed. FIG. 1A illustrates application icons as an example of the image IM.

The display region DA may have a rectangular shape in a plan view, e.g., a view along the third direction DR3 (e.g., planar shape). The non-display region NDA may surround the display region DA. However, the invention is not limited thereto, such that the shape of the display region DA and the shape of the non-display region NDA may be relatively designed.

The display device DD may sense an external input TC applied from outside of the display device DD. The external input TC (otherwise referred to as a user's input TC) includes various types of external inputs, such contact, light, heat, or pressure applied from an input tool such as a portion of a user's body. In this embodiment, the user's input TC is illustrated as a hand contacting the front surface of the display device DD. However, this is illustrated by way of example, and as described above, the user's input TC may be provided in various forms (for example, an input using a user's hand, an input using a tool such as a touch pen or a stylus pen, etc.). In addition, the display device DD may sense the user's input TC applied to the side surface or rear surface of the display device DD according to the structure of the display device DD, and is not limited to any one embodiment.

The display device DD may display an image IM by activating the display surface DS, and sense an external input TC at the same time. In this embodiment, it is illustrated that the region for sensing the external input TC is provided in the display region DA in which the image IM is displayed. However, this is illustrated by way of example, and the region for sensing the external input TC may be provided in the non-display region NDA, or provided in all regions of the display surface DS.

The display device DD may include a non-folding area provided in plural including a plurality of non-folding areas, and a folding are adjacent to the non-folding area. A first non-folding region NFA1, a folding region FA, and a second non-folding region NFA2 may be sequentially defined in the display device DD, in (or along) the second direction DR2. That is, the folding region FA may be defined between the first non-folding region NFA1 and the second non-folding region NFA2. One folding region FA and two non-folding regions are illustrated in FIGS. 1A and 1B, but the number of the folding region FA and the number of the non-folding regions is not limited thereto. In an embodiment, for example, the display device DD may include more than two non-folding regions and a plurality of folding regions disposed between the non-folding regions.

The display device DD which is foldable, may be folded with respect to a folding axis FX. That is, the folding region FA at which the display device DD is foldable or bendable, may be bent with respect to the folding axis FX. The folding axis FX may extend in the first direction DR1. The folding axis FX may be defined as a short axis parallel to the short side of the display device DD. Various components or layers of the display device DD may include a folding area (or region), a non-folding area (or region) and a folding axis corresponding to those described above. Various components or layers of the display device DD may be bendable or foldable together with each other.

The display device DD which is folded, may dispose portions of the display surface DA, at the first non-folding region NFA1 and the second non-folding region NFA2, facing each other. Accordingly, in the folded state, the display surface DS may not be exposed to outside the display device DD. However, this is provided as an example and the invention is not limited thereto. In an embodiment, when the display device DD is folded, portions of the display surface DA, at the first non-folding region NFA1 and the second non-folding region NFA2, may face away from each other. Accordingly, in the folded state, the display surface DS may be exposed to outside the display device DD.

Figure 2A:
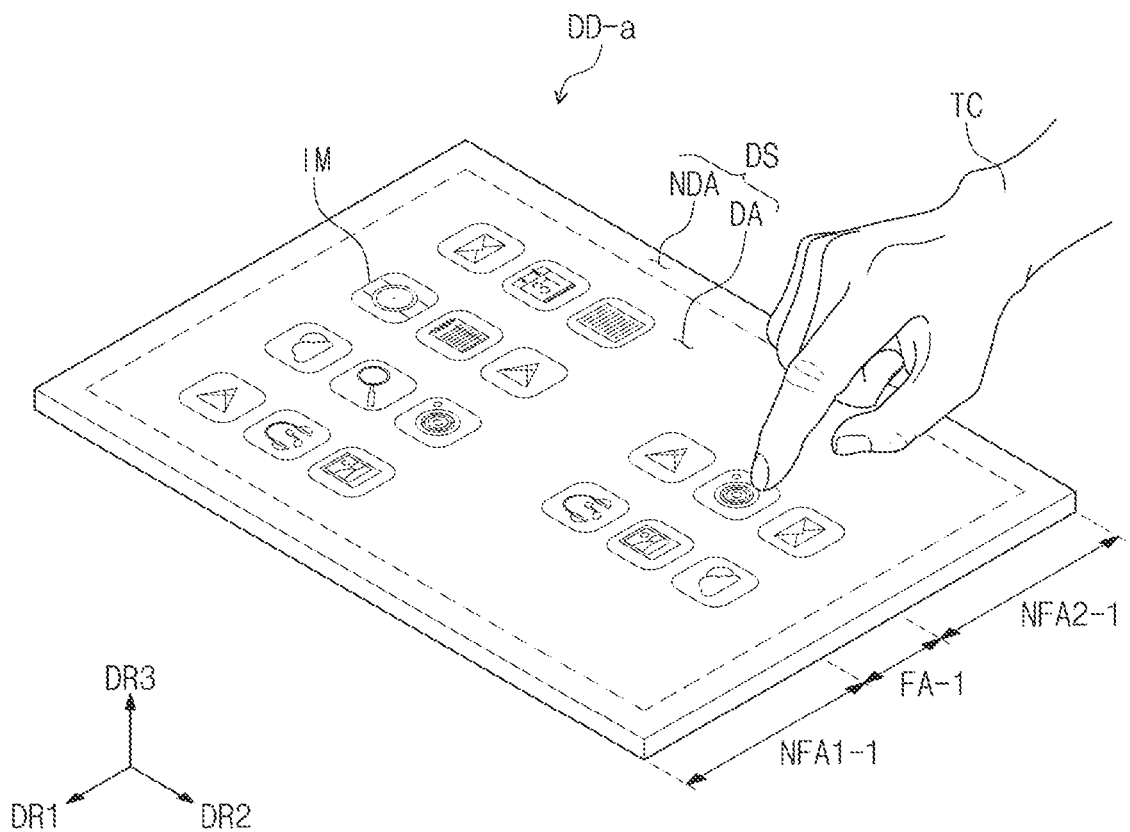
FIGS. 2A and 2B are perspective views of an embodiment of a display device.
Figure 2B:
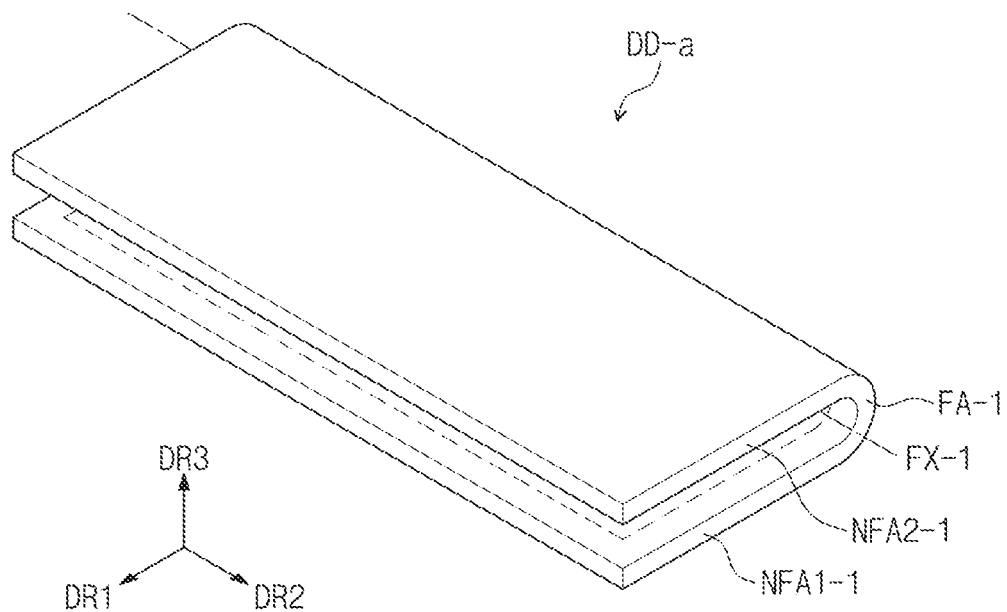

FIG. 2A is a perspective view of an embodiment of a display device DD-a. FIG. 2B is a perspective view of an embodiment of a display device DD-a. FIG. 2A illustrates an embodiment of the display device DD-a which is unfolded, and FIG. 2B illustrates an embodiment of the display device DD-a illustrated in FIG. 2A which is folded.

Referring to FIGS. 2A and 2B, a first non-folding region NFA1-1, a folding region FA-1, and a second non-folding region NFA2-1 may be sequentially defined in the display device DD-a along the first direction DR1. The folding region FA-1 may be defined between the first non-folding region NFA1-1 and the second non-folding region NFA2-1.

The display device DD-a may be folded with respect to the folding axis FX-1. That is, the folding region FA-1 may be bent with respect to the folding axis FX-1. The folding axis FX-1 may extend along the second direction DR2. The folding axis FX-1 may be defined as a long axis parallel to a long side of the display device DD-a.

Hereinafter, the structure of the display device DD that is foldable with respect to the short axis will be described. However, the invention is not limited thereto, and the structures to be described later may also be applied to the display device DD-a that is foldable with respect to the long axis.

Figure 3:
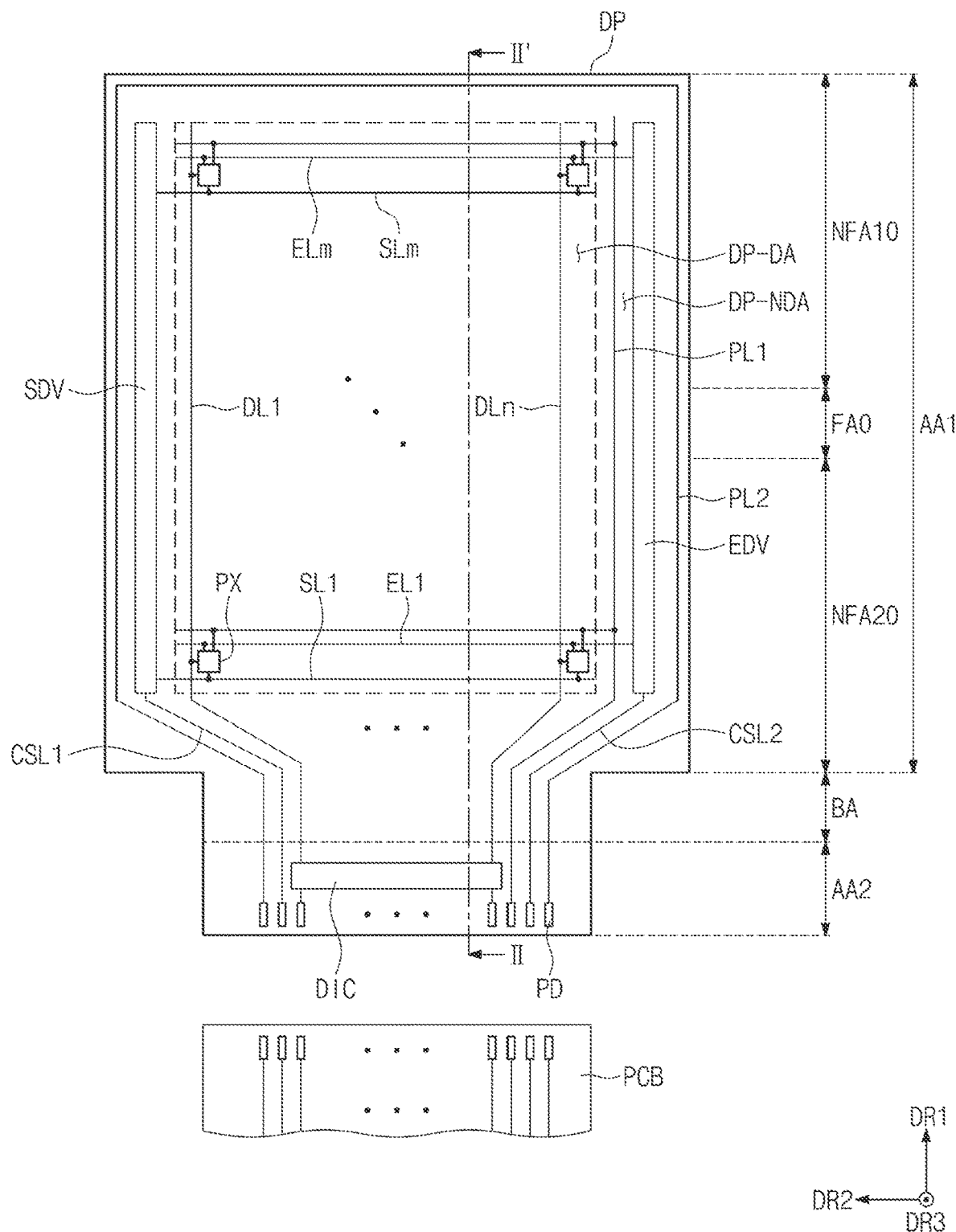
FIG. 3 is a plan view of an embodiment of a display panel.
Figure 4:
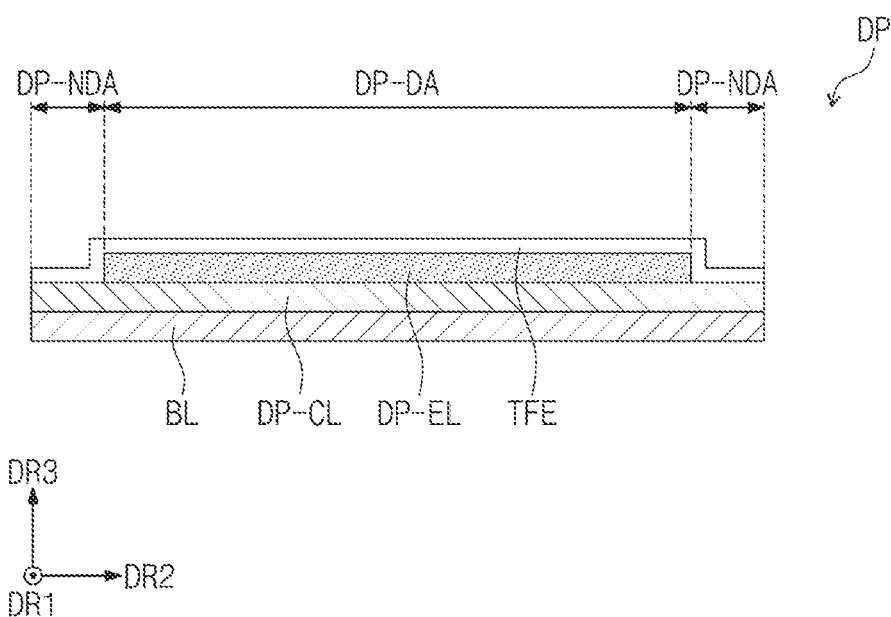
FIG. 4 is a cross-sectional view of an embodiment of a display panel.

FIG. 3 is a plan view of an embodiment of a display panel DP. FIG. 4 is a cross-sectional view of an embodiment of a display panel DP.

The display panel DP may be a light-emitting display panel, and is not particularly limited. In an embodiment, for example, the display panel DP may be an organic light-emitting display panel or a quantum dot light-emitting display panel. A light-emitting layer of the organic light-emitting display panel may include an organic light-emitting material. A light-emitting layer of the quantum dot light-emitting display panel may include quantum dots, quantum rods, and the like. Hereinafter, the display panel DP will be described as an organic light-emitting display panel.

Referring to FIG. 3, the display panel DP may include a display region DP-DA and a non-display region DP-NDA which is adjacent to the display region DP-DA. The display region DP-DA and the non-display region DP-NDA are divided according to an arrangement of the PX. The display region DP-DA and the non-display region DP-NDA respectively correspond to the display region DA and the non-display region NDA in FIG. 1A. In this specification, the wording, "a region/part corresponds to a region/part" means that the region/part overlaps the region/part, and is not limited to having the same area (e.g., planar area, dimensions, etc.). A scan driver SDV, a driving circuit DIC, and an emission driver EDV may be disposed in the non-display region DP-NDA.

The display panel DP includes a first region AA1, a second region AA2, and a bending region BA divided in the first direction DR1. When the display device DD is folded as illustrated in FIG. 1B, the first region AA1 and the second region AA2 of the display panel DP within the display device DD are disposed on different planes. This is illustrated in FIG. 6B. The bending region BA is disposed between the first region AA1 and the second region AA2. A bending shape of the bending region BA will be described later with reference to FIG. 6B. FIG. 3 illustrates the display panel DP of the display device DD which is unfolded.

The first region AA1 corresponds to the display surface DS in FIG. 1A. The first region AA1 may include a first non-folding region NFA10, a second non-folding region NFA20, and a folding region FA0. The first non-folding region NFA10, the second non-folding region NFA20, and the folding region FA0 respectively correspond to the first non-folding region NFA1, the second non-folding region NFA2, and the folding region FA in FIG. 1A.

A total length of the bending region BA and the second region AA2 in the second direction DR2 may be smaller than a length of the first region AA1 in the second direction DR2. The second region AA2 and the bending region BA may be a portion of the non-display region DP-NDA.

The display panel DP may include a pixel PX provided in plural including a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, and a pad PD provided in plural including a plurality of pads PD. Here, 'm' and 'n' are natural numbers. The pixels PX may be connected to the scan lines SL1 to SLm, the data lines DL1 to DLn, and the emission lines EL1 to ELm.

The driving circuit DIC may be disposed in the second region AA2. The driving circuit DIC may be an integrated circuit chip. The scan lines SL1 to SLm may extend in the second direction DR2 to be connected to the scan driver SDV. The data lines DL1 to DLn may extend in the first direction DR1 and may be connected to the driving circuit DIC, via signal lines in the bending region BA. The emission lines EL1 to ELm may extend in the second direction DR2 and may be connected to the emission driver EDV.

The first power line PL1 may include a portion extending in the first direction DR1 and a portion extending in the second direction DR2. The portion extending in the first direction DR1 and the portion extending in the second direction DR2 may be disposed on different layers from each other. As being on different layers, elements may be in different layers from each other as respective portions of different material layers, may form an interface with different underlying or overlying layer, etc., without being limited thereto. A portion of the first power line PL1 extending in the first direction DR1 may extend to the second region AA2, via the bending region BA. The first power line PL1 may provide a first voltage to the pixels PX.

The second power line PL2 may be disposed in the non-display region DP-NDA and extend along the edge of the first region AA1 (e.g., outer edge of the display panel DP). The second power line PL2 may be disposed outside the scan driver SDV and the emission driver EDV, that is, closer to the outer edge of the display panel DP than the scan driver SDV and the emission driver EDV.

A first control line CSL1 may be connected to the scan driver SDV and may extend toward a lower end of the second region AA2, via the bending region BA. A second control line CSL2 may be connected to the emission driver EDV and may extend toward a lower end of the second region AA2, via the bending region BA.

In a plan view (e.g., along the thickness direction), the pads PD may be disposed adjacent to the lower end of the second region AA2. The driving circuit DIC, the first power line PL1, the second power line PL2, the first control line CSL1, and the second control line CSL2 may be connected to the pads PD. A printed circuit board PCB may be electrically connected to the display panel DP, at the pads PD, such as through an anisotropic conductive adhesive layer.

Each of the pixels PX may include a light-emitting element LD and a pixel driving circuit that controls light emission of the light-emitting element LD. The pixel driving circuit includes a plurality of transistors and at least one capacitor. The pixel driving circuit is connected to the light-emitting element LD.

Referring to FIG. 4, the display panel DP may include a base layer BL, a circuit element layer DP-CL disposed on the base layer BL, a light-emitting element layer DP-EL disposed on the circuit element layer DP-CL, and an encapsulation layer TFE disposed on the light-emitting element layer DP-EL.

The base layer BL may include a synthetic resin film. In an embodiment, for example, the base layer BL may include polyimide (PI). The base layer BL may have a multilayer structure. The base layer BL may include a first synthetic resin film, at least one inorganic layer disposed on the first synthetic resin film, and a second synthetic resin film disposed on the inorganic layer. Each of the first synthetic resin film and the second synthetic resin film may be a polyimide film.

The circuit element layer DP-CL may include an organic layer, an inorganic layer, a semiconductor pattern, a conductive pattern, a signal line, and the like. The organic layer, the inorganic layer, the semiconductor layer, and the conductive layer may be formed (or provided) on the base layer BL through a method such as coating and deposition. Thereafter, the organic layer, the inorganic layer, the semiconductor layer, and the conductive layer may be selectively patterned by performing a photolithography process multiple times, and thus a semiconductor pattern, a conductive pattern, and a signal line may be formed.

The semiconductor pattern, the conductive pattern, and the signal line may form the pixel driving circuit and signal lines SL1~SLm, DL1~DLn, EL1~ELm, CSL1, CSL2, PL1, and PL2 of the pixels PX described with reference to FIG. 3. The pixel driving circuit may include at least one transistor.

The light-emitting element layer DP-EL may include light-emitting elements LD of the pixels PX described with reference to FIG. 3. The light-emitting element LD is electrically connected to at least one transistor. In addition, the light-emitting element layer DP-EL may further include at least one of an organic layer or an inorganic layer.

The encapsulation layer TFE may be disposed on the circuit element layer DP-CL to cover the light-emitting element layer DP-EL. The encapsulation layer TFE may include an inorganic layer, an organic layer, and an inorganic layer sequentially stacked. A stacked structure of the encapsulation layer TFE is not particularly limited.

The planar shape of the base layer BL is substantially the same as the planar shape of the display panel DP illustrated in FIG. 3. The base layer BL is disposed in the display region DP-DA and the non-display region DP-NDA.

The pixel driving circuit of the circuit element layer DP-CL is disposed in the display region DP-DA. In addition, some of the signal lines of the circuit element layer DP-CL are disposed in the display region DP-DA and the non-display region DP-NDA.

A light-emitting element LD of the light-emitting element layer DP-EL is disposed in the display region DP-DA. The encapsulation layer TFE is disposed in the display region DP-DA and the non-display region DP-NDA. However, the encapsulation layer TFE may sufficiently cover the display region DP-DA but not fully cover the non-display region DP-NDA.

Figure 5:
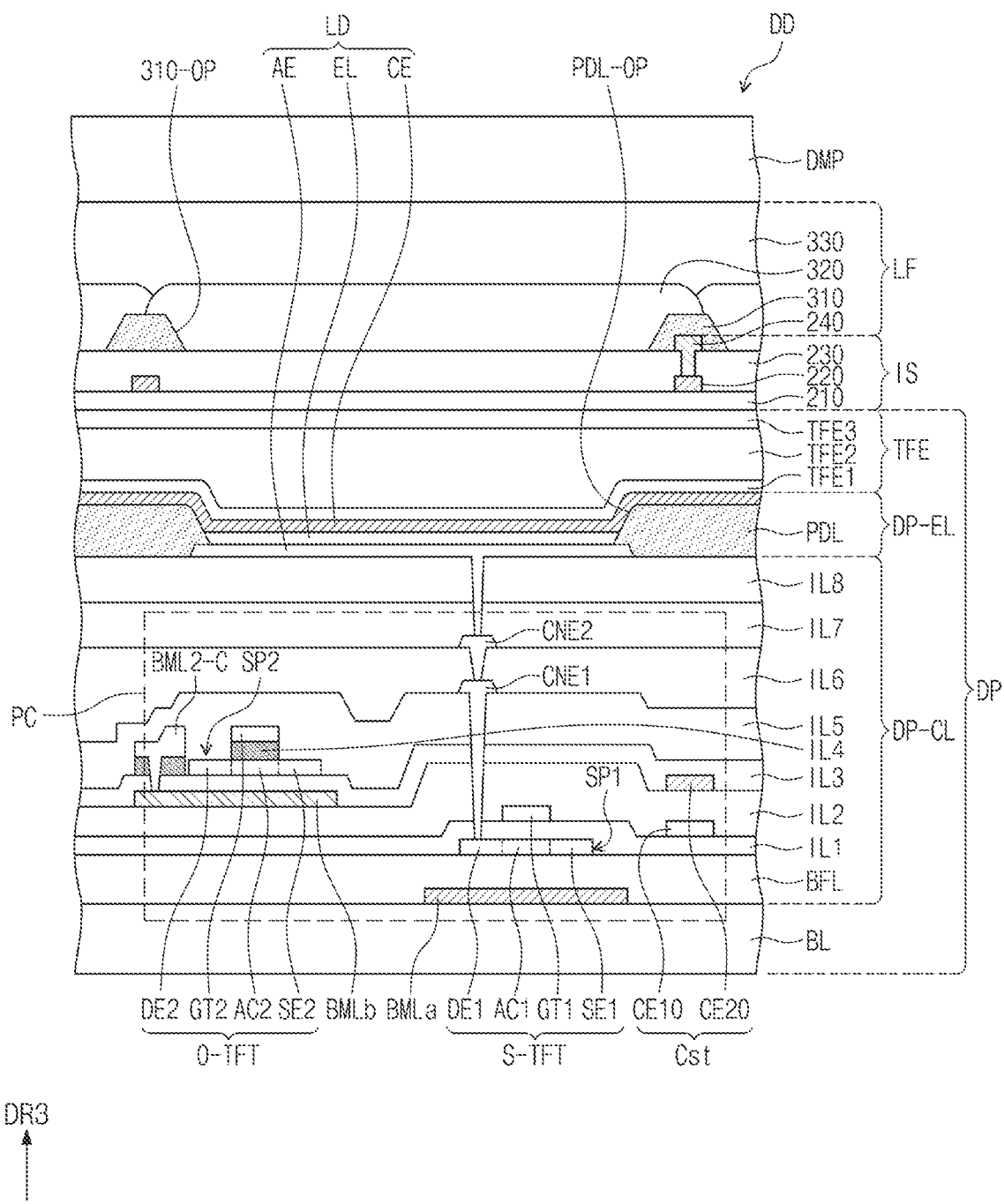
FIG. 5 is a cross-sectional view illustrating an embodiment of a display device.

FIG. 5 is a cross-sectional view illustrating an embodiment of a display device DD. In FIG. 5, components corresponding to a pixel PX are illustrated in more detail for the display panel DP, an input sensor IS, an anti-reflection layer LF, and a shock absorbing layer DMP of the display device DD.

FIG. 5 illustrates one light-emitting element LD, and a silicon transistor S-TFT and an oxide transistor O-TFT of a pixel circuit PC. At least one of a plurality of transistors included in the pixel circuit PC may be an oxide transistor O-TFT, and the remaining transistors may be silicon transistors S-TFT.

A buffer layer BFL may be disposed on the base layer BL. The buffer layer BFL may prevent diffusion of metal atoms or impurities from the base layer BL into a first semiconductor pattern SP1 disposed thereabove. The first semiconductor pattern SP1 includes an active region AC1 of the silicon transistor S-TFT. The buffer layer BFL may control a heat supply rate during a crystallization process for forming the first semiconductor pattern SP1, so that the first semiconductor pattern SP1 is uniformly formed.

A first back metal layer BMLa may be disposed below the silicon transistor S-TFT, and a second back metal layer BMLb may be disposed below the oxide transistor O-TFT. The first and second back metal layers BMLa and BMLb may be disposed to overlap the pixel circuit PC. The first and second back metal layers BMLa and BMLb may block external light from reaching the pixel circuit PC.

The first back metal layer BMLa may be disposed to correspond to at least a partial region of the pixel circuit PC. The first back metal layer BMLa may be disposed to overlap a driving transistor configured with a silicon transistor S-TFT.

The first back metal layer BMLa may be disposed between the base layer BL and the buffer layer BFL. In an embodiment, an inorganic barrier layer may be further disposed between the first back metal layer BMLa and the buffer layer BFL. The first back metal layer BMLa may be connected to an electrode or a wiring which is conductive, and may receive a constant voltage or a signal (e.g., electrical signal) therefrom. According to an embodiment, the first back metal layer BMLa may be a floating electrode electrically isolated from other conductive electrodes or wirings.

The second back metal layer BMLb may be disposed to correspond to the lower portion of the oxide transistor O-TFT. The second back metal layer BMLb may be disposed between a second insulating layer IL2 and a third insulating layer IL3. The second back metal layer BMLb and a second electrode CE20 of a storage capacitor Cst may be disposed on a same layer as each other. As being on a same layer, elements may be in a same layer as each other as respective portions of a same material layer, may form an interface with a same underlying or overlying layer, etc., without being limited thereto. The second back metal layer BMLb may be connected to a contact electrode BML2-C to receive a constant voltage or a signal. The contact electrode BML2-C and a gate GT2 of the oxide transistor O-TFT may be disposed on the same layer.

Each of the first back metal layer BMLa and the second back metal layer BMLb may include a reflective metal. In an embodiment, for example, each of the first back metal layer BMLa and the second back metal layer BMLb may include silver (Ag), Ag-containing alloy, molybdenum (Mo), Mo-containing alloy, aluminum (Al), Al-containing alloy, aluminum nitride (AlN), tungsten (W), tungsten nitride (WN), copper (Cu), p+ doped amorphous silicon, and the like. The first back metal layer BMLa and the second back metal layer BMLb may include the same material or different materials.

Although not illustrated separately, according to an embodiment, the second back metal layer BMLb may be omitted. The first back metal layer BMLa may extend from below the silicon transistor S-TFT to a lower portion of the oxide transistor O-TFT, so that the first back metal layer BMLa may further block light incident to the lower portion of the oxide transistor O-TFT.

The first semiconductor pattern SP1 may be disposed on the buffer layer BFL. The first semiconductor pattern SP1 may include a silicon semiconductor. In an embodiment, for example, the silicon semiconductor may include amorphous silicon, polycrystalline silicon, and the like. In an embodiment, for example, the first semiconductor pattern SP1 may include low-temperature polysilicon.

FIG. 5 illustrates only a portion of the first semiconductor pattern SP1 disposed on the buffer layer BFL, and the first semiconductor pattern SP1 may be further disposed in another region. The first semiconductor pattern SP1 may be arranged across the pixels PX. The first semiconductor pattern SP1 may have different electrical properties depending on whether the semiconductor material along the first semiconductor pattern SP1 is doped or not. The first semiconductor pattern SP1 may include a first region having high conductivity and a second region having low conductivity lower than the high conductivity. The first region may be doped with an N-type dopant or a P-type dopant. A P-type transistor may include a doped region doped with a P-type dopant, and an N-type transistor may include a doped region doped with an N-type dopant. The second region may be an undoped region, or a region doped at a concentration lower than in the first region.

The first region may have higher conductivity than the second region, and may serve as an electrode or a signal line substantially. The second region may substantially correspond to an active region (or channel) of the transistor. In other words, a portion of the first semiconductor pattern SP1 may be an active region of the transistor, another portion may be a source or drain of the transistor, and still another portion may be a connection electrode or a connection signal line.

A source region SE1 (or a source), an active region AC1 (or a channel), and a drain region DE1 (or a drain) of the silicon transistor S-TFT may be formed from the first semiconductor pattern SP1. The source region SE1 and the drain region DE1 may extend in opposite directions from the active region AC1, on a cross-section.

A first insulating layer IL1 may be disposed on the buffer layer BFL. The first insulating layer IL1 may overlap, in common, the plurality of pixels PX and may cover the first semiconductor pattern SP1. The first insulating layer IL1 may be an inorganic layer and/or an organic layer, and may have a single-layer or multilayer structure. The first insulating layer IL1 may include at least one of aluminum oxide, titanium oxide, silicon oxide, silicon nitride, silicon oxynitride, zirconium oxide, or hafnium oxide. In this embodiment, the first insulating layer IL1 may be a single-layer silicon oxide layer. Not only the first insulating layer IL1 but also an insulating layer of the circuit element layer DP-CL to be described later may be an inorganic layer and/or an organic layer, and may have a single-layer or multilayer structure. The inorganic layer may include at least one of the above-described materials, but the invention is not limited thereto.

The gate GT1 of the silicon transistor S-TFT is disposed on the first insulating layer IL1. The gate GT1 may be a portion of a metal pattern (e.g., respective pattern of a metal material layer). The gate GT1 overlaps the active region AC1. In the process of doping the first semiconductor pattern SP1, the gate GT1 may function as a mask. The gate GT1 may include titanium (Ti), silver (Ag), Ag-containing alloy, molybdenum (Mo), Mo-containing alloy, aluminum (Al), Al-containing aluminum, aluminum nitride (AlN), tungsten (W), tungsten nitride (WN), copper (Cu), indium tin oxide (ITO), indium zinc oxide (IZO), etc., but an embodiment of the invention.

The second insulating layer IL2 may be disposed on the first insulating layer IL1, and may cover the gate GT1. The third insulating layer IL3 may be disposed on the second insulating layer IL2. The second electrode CE20 of the storage capacitor Cst may be disposed between the second insulating layer IL2 and the third insulating layer IL3. In addition, a first electrode CE10 of the storage capacitor Cst may be disposed between the first insulating layer IL1 and the second insulating layer IL2.

A second semiconductor pattern SP2 may be disposed on the third insulating layer IL3. The second semiconductor pattern SP2 may include an active region AC2 of an oxide transistor O-TFT to be described later. The second semiconductor pattern SP2 may include an oxide semiconductor. The second semiconductor pattern SP2 may include a transparent conductive oxide TCO such as indium tin oxide (ITO), indium zinc oxide (IZO), indium gallium zinc oxide (IGZO), zinc oxide (ZnO), or indium oxide ($In_2O_3$).

The oxide semiconductor may include a plurality of regions divided according to whether the transparent conductive oxide is reduced. A region (hereinafter, a reduction region) in which the transparent conductive oxide is reduced has higher conductivity than a region (hereinafter, a non-reduction region) in which the transparent conductive oxide is not reduced. The reduction region substantially serves as the source/drain or signal line of the transistor. The non-reduction region substantially corresponds to the semiconductor region (or active region or channel) of the transistor. In other words, a portion of the second semiconductor pattern SP2 may be the semiconductor region of the transistor, another portion may be a source or drain of the transistor, and still another portion may be a signal transmission region.

A source region SE2 (or source), an active region AC2 (or channel), and a drain region DE2 (or drain) of the oxide transistor O-TFT may be formed from the second semiconductor pattern SP2. The source region SE2 and the drain region DE2 may extend in opposite directions from the active region AC2, on a cross-section.

The fourth insulating layer IL4 may be disposed on the third insulating layer IL3. As illustrated in FIG. 5, the fourth insulating layer IL4 may be an insulating pattern overlapping the gate GT2 of the oxide transistor O-TFT and exposing the source region SE2 and the drain region DE2 of the oxide transistor O-TFT. As illustrated in FIG. 5, the fourth insulating layer IL4 may cover the second semiconductor pattern SP2.

As illustrated in FIG. 5, the gate GT2 of the oxide transistor O-TFT is disposed on the fourth insulating layer IL4. The gate GT2 of the oxide transistor O-TFT may be a portion of the metal pattern. The gate GT2 of the oxide transistor O-TFT overlaps the active region AC2.

A fifth insulating layer IL5 may be disposed on the fourth insulating layer IL4, and may cover the gate GT2. A first connection electrode CNE1 may be disposed on the fifth insulating layer IL5. The first connection electrode CNE1 may be connected to the drain region DE1 of the silicon transistor S-TFT through a contact hole passing through the first to fifth insulating layers IL1, IL2, IL3, IL4, and IL5.

A sixth insulating layer IL6 may be disposed on the fifth insulating layer IL5. A second connection electrode CNE2 may be disposed on the sixth insulating layer IL6. The second connection electrode CNE2 may be connected to the first connection electrode CNE1 through a contact hole passing through the sixth insulating layer IL6. A seventh insulating layer IL7 may be disposed on the sixth insulating layer IL6 and may cover the second connection electrode CNE2. An eighth insulating layer IL8 may be disposed on the seventh insulating layer IL7.

Each of the sixth insulating layer IL6, the seventh insulating layer IL7, and the eighth insulating layer IL8 may be an organic layer. In an embodiment, for example, each of the sixth insulating layer IL6, the seventh insulating layer IL7, and the eighth insulating layer IL8 may include a general-purpose polymer such as benzocyclobutene (BCB), polyimide, hexamethyldisiloxane (HMDSO), polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light-emitting element LD may include a first electrode AE, a light-emitting layer EL, and a second electrode CE. The second electrode CE may be provided, in common, in the plurality of light-emitting elements LD.

The first electrode AE of the light-emitting element LD may be disposed on the eighth insulating layer IL8. The first electrode AE of the light-emitting element LD may be a (semi)transmissive electrode or a reflective electrode. According to an embodiment, each of the first electrodes AE of the light-emitting element LD may include a reflective layer formed of Ag, Mg, Al, Pt, Pd, Au, Ni, Nd, Ir, Cr or a compound thereof and a transparent or translucent electrode layer formed on the reflective layer. The transparent or translucent electrode layer may include at least one selected from indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode AE of the light-emitting element LD may include a stacked structure of ITO/Ag/ITO.

A pixel defining layer PDL may be disposed on the eighth insulating layer IL8. The pixel defining layer PDL may have a light-absorbing property, and for example, the pixel defining layer PDL may have a black color. The pixel defining layer PDL may contain a black coloring agent. The black coloring agent may contain a black dye and a black pigment. The black coloring agent may contain carbon black, a metal such as chromium, or an oxide thereof. The pixel defining layer PDL may correspond to a light blocking pattern having light blocking characteristics.

The pixel defining layer PDL may cover a portion of the first electrode AE of the light-emitting element LD. In an embodiment, for example, an opening PDL-OP that exposes a portion of the first electrode AE of the light-emitting element LD may be defined in (or by portions of) the pixel defining layer PDL. The pixel defining layer PDL may increase a distance between the edge of the first electrode AE of the light-emitting element LD, and the second electrode CE. Accordingly, the pixel defining layer PDL may serve to prevent an electrical arc from occurring at the edge of the first electrode AE.

Although not illustrated, a hole control layer may be disposed between the first electrode AE and the light-emitting layer EL. The hole control layer may include a hole transport layer and may further include a hole injection layer. An electron control layer may be disposed between the light-emitting layer EL and the second electrode CE. The electron control layer may include an electron transport layer and may further include an electron injection layer. The hole control layer and the electron control layer may be formed, in common, in the plurality of pixels PX (see FIG. 3) using an open mask.

The encapsulation layer TFE may be disposed on the light-emitting element layer DP-EL. The encapsulation layer TFE may include a first inorganic layer TFE1, an organic layer TFE2, and a second inorganic layer TFE3 that are sequentially stacked in order from the light-emitting element layer DP-EL, but the layers constituting the encapsulation layer TFE are not limited thereto.

The inorganic layers TFE1 and TFE3 may protect the light-emitting element layer DP-EL from moisture and oxygen, and the organic layer TFE2 may protect the light-emitting element layer DP-EL from foreign substances such as dust particles. The inorganic layers TFE1 and TFE3 may include a silicon nitride layer, a silicon oxynitride layer, a silicon oxide layer, a titanium oxide layer, an aluminum oxide layer, or the like. The organic layer TFE2 may include an acryl-based organic layer, but an embodiment of the inventive concept is not limited thereto.

The input sensor IS may be disposed on the display panel DP. The input sensor IS may be referred to as a sensor, an input sensing layer, or an input sensing panel. The input sensor IS may include a sensor base layer 210, a first conductive layer 220, a sensi (or ng insulating layer 230, and a second conductive layer 240.

The sensor base layer 210 may be directly disposed on the display panel DP. Elements which are related directly with each other, may form an interface therebetween, without being limited thereto. The sensor base layer 210 may be an inorganic layer including at least one of silicon nitride, silicon oxynitride, or silicon oxide. Alternatively, the sensor base layer 210 may be an organic layer including an epoxy resin, an acryl resin, or an imide-based resin. The sensor base layer 210 may have a single-layer structure or a multilayer structure stacked along the third direction DR3.

Each of the first conductive layer 220 and the second conductive layer 240 may have a single-layer structure or a multilayer structure in which layers are stacked along the third direction DR3. The first conductive layer 220 and the second conductive layer 240 may include conductive lines (patterns) defining a mesh-shaped sensing electrode. The conductive lines may not overlap the opening PDL-OP and may overlap the pixel defining layer PDL.

A single-layered conductive layer may include a metal layer or a transparent conductive layer. The metal layer may include molybdenum, silver, titanium, copper, aluminum, or an alloy thereof. A transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, metal nanowires, graphene, and the like.

A multilayered conductive layer may include metal layers which are sequentially stacked. The metal layers may have, for example, a three-layer structure of titanium/aluminum/titanium. The multilayered conductive layer may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensing insulating layer 230 may include an organic film. The organic film may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The anti-reflection layer LF may be disposed on the input sensor IS. The anti-reflection layer LF may include a division layer 310, a plurality of color filters 320, and a planarization layer 330.

A material constituting the division layer 310 is not particularly limited as long as the material absorbs light. The division layer 310 has a black color, and in an embodiment, the division layer 310 may contain a black coloring agent. The black coloring agent may contain a black dye and a black pigment. The black coloring agent may contain carbon black, a metal such as chromium, or an oxide thereof.

The division layer 310 may cover the second conductive layer 240 of the input sensor IS. The division layer 310 may prevent reflection of external light caused by the second conductive layer 240. In some regions of the display panel DP, the division layer 310 may be omitted. The transmittance of a region in which the division layer 310 is omitted and thus not provided may be higher than those of other regions.

An opening 310-OP may be defined in (or by patterns of) the division layer 310. The opening 310-OP may overlap the first electrode AE of the light-emitting element LD. One of the plurality of color filters 320 may overlap the first electrode AE of the light-emitting element LD. One of the plurality of color filters 320 may cover the opening 310-OP. Each of the plurality of color filters 320 may contact the division layer 310.

The planarization layer 330 may cover the division layer 310 and the plurality of color filters 320. The planarization layer 330 may include an organic material, and the upper surface of the planarization layer 330 may be provided as a flat surface. In an embodiment, the planarization layer 330 may be omitted.

The shock absorbing layer DMP may be disposed on the display panel DP. Specifically, the shock absorbing layer DMP may be disposed facing the display panel with the anti-reflection layer LF therebetween. The shock absorbing layer DMP may have a multilayer structure or a single-layer structure, and may have, for example, a single-layer structure.

The shock absorbing layer DMP may include a polymer. In an embodiment, for example, the shock absorbing layer DMP may include polyimide, polycarbonate, polyamide, triacetylcellulose, or polymethylmethacrylate, or polyethylene terephthalate.

A modulus of the shock absorbing layer DMP may be smaller than or equal to a modulus of a window protective layer PF of a window module WM, which will be described later. The shock absorbing layer DMP may include a polymer and have a modulus equal to or lower than that of the window protective layer PF, and thus may have excellent flexibility.

The shock absorbing layer DMP may absorb an external shock applied to the front surface of the display device DD. Specifically, the shock absorbing layer DMP may serve to prevent deformation of the display panel DP. In an embodiment, for example, the shock absorbing layer DMP may increase resistance to shock caused by pressure from an input tool. Accordingly, it is possible to prevent defects such as a bright spot from occurring in the display panel DP.

In an embodiment, the shock absorbing layer DMP may have a thickness of about 50 micrometers ($\mu$m) to about 80 $\mu$m. In an embodiment, for example, the shock absorbing layer DMP may have a thickness of about 60 $\mu$m to about 70 $\mu$m, for example, about 66 $\mu$m. As the thickness of the shock absorbing layer DMP satisfies the above-described range, an impact strength-enhancing effect by the shock absorbing layer DMP may be obtained, and a folding operation of the display device DD may be more easily performed in room-temperature, low-temperature and high-temperature ranges.

The display device DD according to one or more embodiment may include, in place of a polarizing film, the color filter layer including the color filters 320 and the division layer 310 in the anti-reflection layer LF. The shock absorbing layer DMP may compensate for a decrease in impact strength of the display device DD as the polarizing film is not included, thereby increasing impact strength. The display device DD according to one or more embodiment may include the color filter layer and the shock absorbing layer DMP to maintain excellent impact resistance.

Figure 6A:
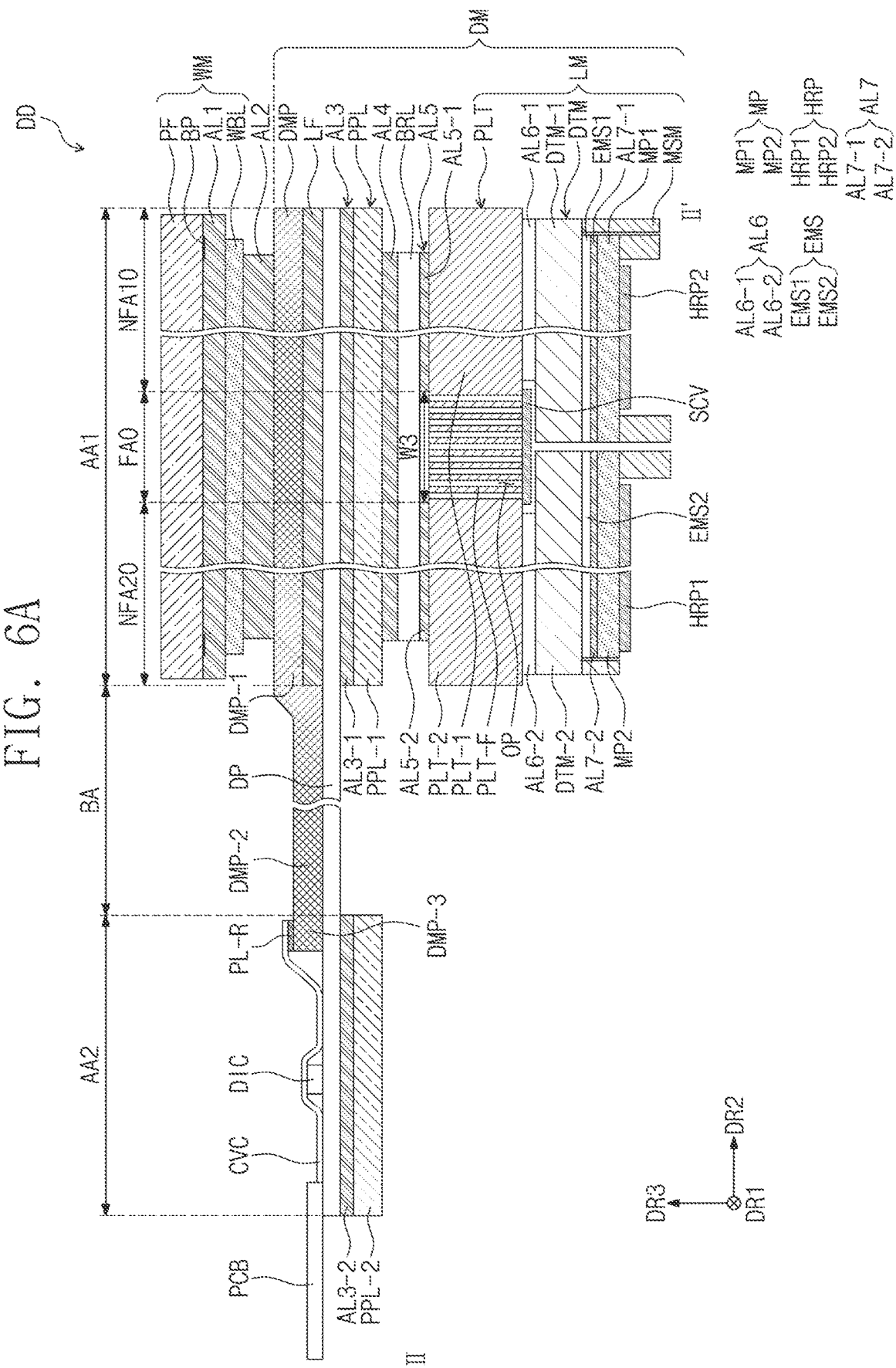
FIG. 6A is a cross-sectional view of an embodiment of a display device which is unfolded.
Figure 6B:
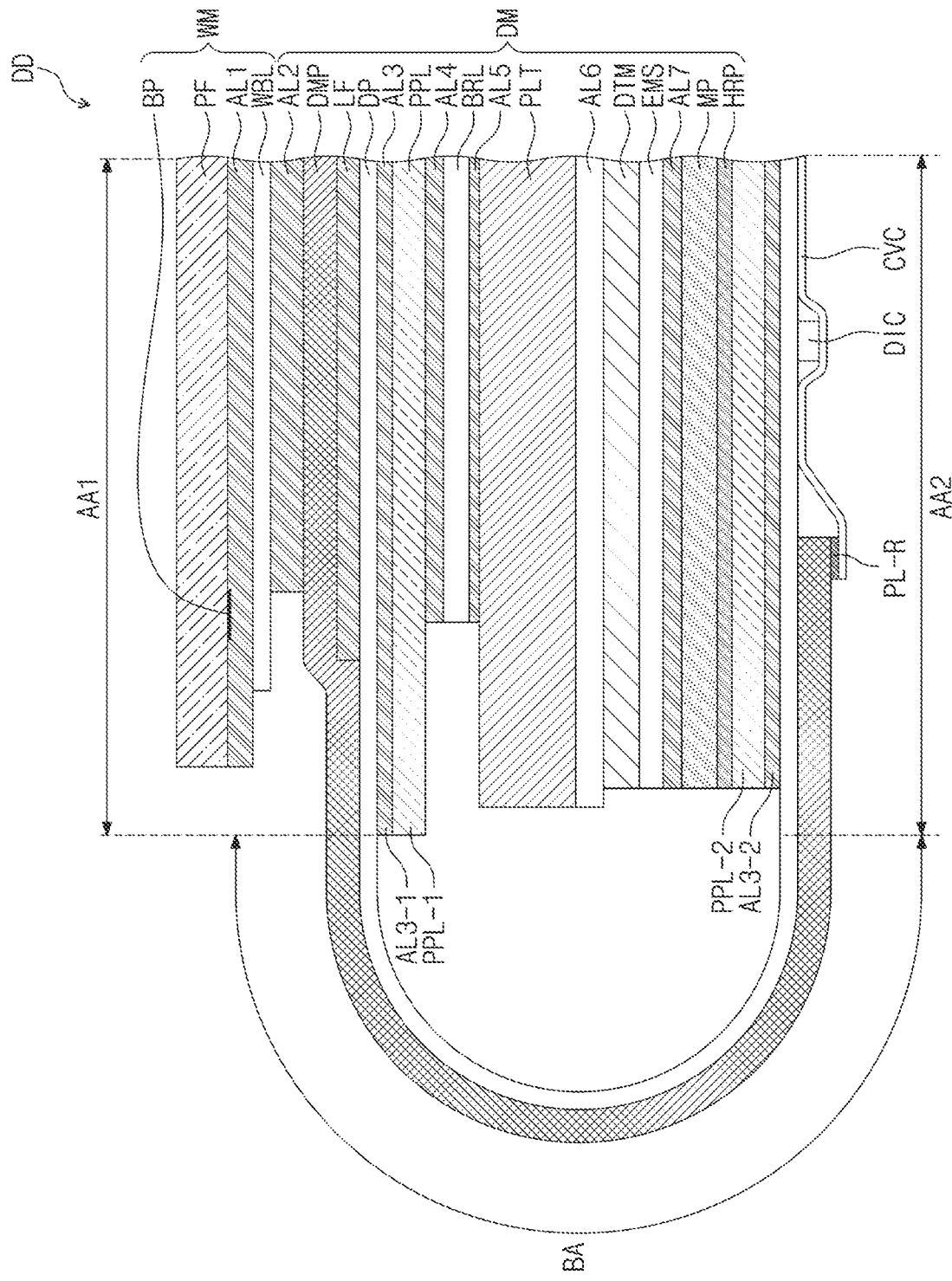
FIG. 6B is a cross-sectional view of an embodiment of a display device which is bent.

FIG. 6A is a cross-sectional view of an embodiment of a display device DD which is unfolded. FIG. 6B is a cross-sectional view of an embodiment of a display device DD which is bent. FIG. 6A illustrates a cross-sectional view taken along line II-II' of FIG. 3. FIG. 6B illustrates a partial cross-sectional view of an embodiment of the display device DD, at the bending region BA of FIG. 6A which is bent. FIG. 6A is a view of the display panel DP which is unfolded (e.g., unbent). Assuming that the display panel DP is installed in the display device DD, the first region AA1 and the second region AA2 of the display panel DP are disposed in different planes when the display device DD is folded, as illustrated in FIG. 1B. This is illustrated in FIG. 6B. The bent shape of the bending region BA will be described later with reference to FIG. 6B.

Referring to FIGS. 6A and 6B, the display device DD includes the window module WM and a display module DM.

The window module WM may include a window base layer WBL, a window protective layer PF disposed on the window base layer WBL, and a bezel pattern BP disposed on the lower surface of the window protective layer PF. In this embodiment, the window protective layer PF may include a plastic film. The window module WM may further include a first adhesive layer AL1 that bonds the window protective layer PF and the window base layer WBL to each other.

The bezel pattern BP may overlap the non-display region DP-NDA illustrated in FIG. 2. The bezel pattern BP may be disposed on one surface of the window base layer WBL or one surface of the window protective layer PF. FIG. 6A exemplarily illustrates the bezel pattern BP disposed on the lower surface of the window protective layer PF. However, is the invention is not limited thereto, and the bezel pattern BP may be disposed on the upper surface of the window protective layer PF. The bezel pattern BP may be formed as a colored light blocking layer, and formed, for example, through a coating method. The bezel pattern BP may include a base material and a dye or pigment mixed with the base material. The bezel pattern BP may have a closed line shape on a plane.

On a plane, an edge of the window base layer WBL may not overlap the bezel pattern BP. That is, an outer edge of the window base layer WBL may be spaced apart from the bezel pattern BP. As the above conditions are satisfied, the edge of the window base layer WBL is exposed from the bezel pattern BP, and a fine crack generated at the edge of the window base layer WBL may be inspected through an inspection device. In an embodiment, for example, by photographing the edge of the window base layer WBL on the upper surface of the window protective layer PF using the inspection device such as a microscope, cracks starting from the edge of the window base layer WBL may be observed. However, the invention is not limited thereto, and the bezel pattern BP may overlap the edge of the window base layer WBL.

The window base layer WBL may include a glass substrate or a plastic substrate. In an embodiment, for example, the window base layer WBL may be a plastic substrate containing polyimide, polycarbonate, or polyethylene terephthalate. Alternatively, the window base layer WBL may be a chemically strengthened glass. When the window base layer WBL is a chemically strengthened glass, the window base layer WBL may have a thickness of about 15 $\mu$m to about 45 $\mu$m. The window base layer WBL may minimize the occurrence of wrinkles even when folding and unfolding states are repeated.

The window protective layer PF may have a thickness of about 50 $\mu$m to about 80 $\mu$m. The window protective layer PF may include polyimide, polycarbonate, polyamide, triacetylcellulose, polymethylmethacrylate, or polyethylene terephthalate. Although not illustrated separately, at least one of a hard coating layer, an anti-fingerprint layer, or an anti-reflection layer may be disposed on the upper surface of the window protective layer PF.

The first adhesive layer AL1 may be a pressure sensitive adhesive (PSA) film or optically clear adhesive (OCA) member. Adhesive layers to be described below may also be the same as the first adhesive layer AL1 and may include a typical adhesive.

The first adhesive layer AL1 may be separable from the window base layer WBL (e.g., removably disposed with the window base layer WBL). Since the strength of the window protective layer PF is lower than that of the window base layer WBL, scratches may occur relatively easily at the window protective layer PF. After the first adhesive layer AL1 and the window protective layer PF are separated from the window base layer WBL, a new window protective layer PF may be attached to the window base layer WBL.

Although not illustrated separately, the window protective layer PF may include a plastic resin layer disposed directly on the upper surface of the window base layer WBL. A plastic resin layer in contact with the upper surface of the window base layer WBL may be formed using an insert molding method. Before the plastic resin layer is formed, the bezel pattern BP may be formed on the upper surface of the window base layer WBL. Accordingly, the plastic resin layer may cover the bezel pattern BP.

Although not illustrated separately, a hard coating layer may be disposed on the window protective layer PF. The hard coating layer may be disposed on the outermost surface of the display device DD, and may be a functional layer for improving the use characteristics of the display device DD. In an embodiment, for example, an anti-fingerprint property, an anti-stain property, and an anti-scratch property may be improved by the hard coating layer.

The display module DM includes the shock absorbing layer DMP, the anti-reflection layer LF, the display panel DP, a panel protective layer PPL, a barrier layer BRL, and a lower member LM. The lower member LM may include a support layer PLT, a cover member SCV, a digitizer DTM, an electromagnetic shielding layer EMS, a lower metal plate MP, a heat dissipation layer HRP and a magnetic field shielding sheet MSM. The display module DM may include second to seventh adhesive layers AL2 to AL7. The second to seventh adhesive layers AL2 to AL7 may each include an adhesive such as a pressure sensitive adhesive or an optically clear adhesive. In an embodiment, some of the above-described components may be omitted. In an embodiment, for example, the lower metal plate MP and a seventh adhesive layer AL7 associated therewith may be omitted. In an embodiment, for example, the heat dissipation layer HRP and the magnetic field shielding sheet MSM may be omitted. Although only the display panel DP and the anti-reflection layer LF are illustrated in FIGS. 6A and 6B, an input sensor IS may be further disposed between the display panel DP and the anti-reflection layer LF as illustrated in FIG. 5.

The shock absorbing layer DMP may be disposed on the display panel DP to protect the display panel DP from an external impact. The impact resistance of the display panel DP may be improved through the shock absorbing layer DMP. In particular, although the impact strength may be reduced in a structure in which the anti-reflection layer LF includes the color filter layer (color filters 320 and the division layer 310 in FIG. 5), the impact strength may increase due to inclusion of the shock absorbing layer DMP, thereby improving the impact resistance of the display panel DP. A second adhesive layer AL2 may bond the shock absorbing layer DMP and the window module WM to each other. Although not illustrated, the adhesive layer is also disposed between the shock absorbing layer DMP and the antireflection layer LF, and thus the shock absorbing layer DMP and the antireflection layer LF may also be bonded through the adhesive layer.

The panel protective layer PPL may be disposed below the display panel DP. The panel protective layer PPL may protect the lower portion of the display panel DP. The panel protective layer PPL may include a flexible plastic material. In an embodiment, for example, the panel protective layer PPL may include polyethylene terephthalate. In an embodiment, the panel protective layer PPL may not be disposed in the folding region FA0. The panel protective layer PPL may include a first panel protective layer PPL-1 that protects the first region AA1 of the display panel DP and a second panel protective layer PPL-2 that protects the second region AA2. That is, the panel protective layer PPL may be disconnected at the folding region FA0, such that the first panel protective layer PPL-1 and the second panel protective layer PPL-2 are spaced apart from each other at the folding region FA0.

A third adhesive layer AL3 bonds the panel protective layer PPL and the display panel DP. The third adhesive layer AL3 may include a first portion AL3-1 corresponding to the first panel protective layer PPL-1 and a second portion AL3-2 corresponding to the second panel protective layer PPL-2.

As illustrated in FIG. 6B, when the bending region BA is bent, the second panel protective layer PPL-2 may be disposed, together with the second region AA2, below the first region AA1 and the first panel protective layer PPL-1. The display panel DP which is bent at the bending region BA disposes the first region AA1 and the second region AA2 in different planes. The driving circuit DIC disposed in the second region AA2 may be disposed below the first region AA1. Since the panel protective layer PPL is not disposed in the bending region BA, the bending region BA may be more easily bent.

The bending region BA has a curvature and a radius of curvature. The radius of curvature may be about 0.1 millimeter (mm) to about 0.5 mm.

In one or more embodiment of the display device DD, the shock absorbing layer DMP is disposed in the first region AA1 and extends from the first region AA1 to be disposed in the bending region BA. The shock absorbing layer DMP may overlap the bending region BA, the first region AA1, and the second region AA2. The shock absorbing layer DMP may overlap an entirety of the bending region BA and the first region AA1, and may overlap a portion of the second region AA2 which is closest to the bending region BA.

The shock absorbing layer DMP disposed on the bending region BA may be bent together with the bending region BA of the display panel DP. The shock absorbing layer DMP disposed on the bending region BA of the display panel DP protects the bending region BA from external impact and controls a neutral plane of the bending region BA. The shock absorbing layer DMP may control the stress of the bending region BA so that the neutral plane approaches the signal lines disposed in the bending region BA.

The shock absorbing layer DMP may include a first portion DMP-1 overlapping the first region AA1, a second portion DMP-2 overlapping the bending region BA, and a third portion DMP-3 overlapping the second region AA2. Each of the first portion DMP-1, the second portion DMP-2, and the third portion DMP-3 may include the same material and may be formed through the same process. The first portion DMP-1, the second portion DMP-2, and the third portion DMP-3 may have an integral shape that is not separated or disconnected (e.g., is continuous).

The shock absorbing layer DMP disposed in the first region AA1, that is, at least a portion of a first portion DMP-1 of the shock absorbing layer DMP, may be disposed on the anti-reflection layer LF to protect the pixel PX that overlaps a portion of the first region AA1 of the display panel DP from external impact. The shock absorbing layer DMP disposed in the bending region BA, that is, the second portion DMP-2 of the shock absorbing layer DMP, may reduce external impact applied to the bending region BA and control the stress of the bending region BA.

The second portion DMP-2 of the shock absorbing layer DMP disposed in the bending region BA may be disposed directly on the display panel DP. The second portion DMP-2 may be in contact with the upper surface of the display panel DP, and no other configuration may be disposed between the second portion DMP-2 and the display panel DP.

In the display device DD, the shock absorbing layer DMP disposed on the anti-reflection layer LF may be disposed not only in the first region AA1, but also extend from the first region AA1 and be disposed in a portion of the second region AA2 and the bending region BA. Accordingly, a process operation of manufacturing (or providing) the display device DD may be simplified, so that a process time and cost may be reduced, and a dead space of the display device DD may be reduced.

In a typical display device, a bending protective layer is formed by applying a separate resin or the like to protect the bending region BA and reduce bending stress. However, in a typical display device, it is difficult to control the thickness of the bending protective layer formed through resin, and at least a width of a portion in which the bending protective layer overlaps the first region AA1 should be secured to prevent separation of the bending protective layer, thereby resulting in an increasing in the dead space of the typical display device.

In contrast, in one or more embodiment of the display device DD, the shock absorbing layer DMP disposed on the anti-reflection layer LF extends to cover the bending region BA, and therefore it is possible to protect the bending region BA and reduce bending stress without forming a separate bending protective layer. Accordingly, the bending protective layer forming process may be omitted to reduce process time and cost, and furthermore it may be unnecessary to secure a portion in which the bending protective layer overlaps the first region AA1, thereby reducing the dead space of the display device DD.

As illustrated in FIGS. 6A and 6B, a fourth adhesive layer AL4 bonds the panel protective layer PPL and the barrier layer BRL. The barrier layer BRL may be disposed below the panel protective layer PPL. The barrier layer BRL may increase resistance to a compressive force caused by external pressing. Accordingly, the barrier layer BRL may serve to prevent deformation of the display panel DP. The barrier layer BRL may include a flexible plastic material such as polyimide or polyethylene terephthalate. In addition, the barrier layer BRL may be a colored film having low light transmittance. The barrier layer BRL may absorb light incident from the outside. In an embodiment, for example, the barrier layer BRL may be a black plastic film. When the display device DD is seen from above the window protective layer PF, components disposed below the barrier layer BRL may be invisible from outside the display device DD.

A fifth adhesive layer AL5 bonds the barrier layer BRL and the support layer PLT. The fifth adhesive layer AL5 may include a first adhesive portion AL5-1 and a second adhesive portion AL5-2 which is spaced apart from each other at the folding region FA0. A spaced distance W3 between the first adhesive portion AL5-1 and the second adhesive portion AL5-2, that is, a distance between the first adhesive portion AL5-1 and the second adhesive portion AL5-2 disconnected from each other, corresponds to a width of the folding region FA0 and is larger than a gap between the digitizers DTM, which will be described later. The spaced distance W3 between the first adhesive portion AL5-1 and the second adhesive portion AL5-2 may be about 7 millimeters (mm) to about 15 mm, such as about 9 mm to about 12 mm. In an embodiment, for example, the spaced distance W3 between the first adhesive portion AL5-1 and the second adhesive portion AL5-2 may be about 9.65 mm.

In this embodiment, the first adhesive portion AL5-1 and the second adhesive portion AL5-2 are defined as different portions of a same one adhesive layer, but are not limited thereto. When the first adhesive portion AL5-1 is defined as a portion of one adhesive layer (e.g., the first adhesive layer AL1), the second adhesive portion AL5-2 may be defined as a portion of another adhesive layer (e.g., the second adhesive layer AL2).

The support layer PLT is disposed below the barrier layer BRL. The support layer PLT supports components disposed above the support layer PLT, and maintains the unfolded and folded states of the display device DD. The support layer PLT includes at least a first support portion PLT-1 corresponding to the first non-folding region NFA10, and a second support portion PLT-2 corresponding to the second non-folding region NFA20. The first support portion PLT-1 and the second support portion PLT-2 are disconnected and spaced apart from each other in the second direction DR2, at the folding region FA0.

As in this embodiment, the support layer PLT may further include a folding portion PLT-F which corresponds to the folding region FA0, is disposed between the first support portion PLT-1 and the second support portion PLT-2, and defines a plurality of openings OP defined therein. A plurality of openings OP are defined in the folding portion PLT-F, so that stress applied to the support layer PLT during the folding operation illustrated in FIGS. 1B and 2B may be reduced. The plurality of openings OP defined in the folding portion PLT-F may be provided in a plurality of rows arranged in a staggered manner.

The support layer PLT may be selected from materials that allow a magnetic field generated by a digitizer DTM to be described later to be transmitted without loss or with minimal loss. The support layer PLT may include a nonmetal material. The support layer PLT may include plastic, glass fiber reinforced plastic, or glass. In an embodiment, for example, the support layer PLT may include a carbon fiber reinforced plastic (CFRP). The first support portion PLT-1, the second support portion PLT-2, and the folding portion PLT-F included in the support layer PLT may include the same material. The first support portion PLT-1, the second support portion PLT-2, and the folding portion PLT-F may have an integral shape. However, the invention is not limited thereto, and the support layer PLT may include a metal material. In one or more embodiment of the display device DD, the digitizer DTM may be omitted, and the support layer PLT may include a metal material.

A plurality of openings OP may be defined in a portion of the support layer PLT corresponding to the folding region FA0. A plurality of openings OP may be defined in the folding portion PLT-F of the support layer PLT. The flexibility of the support layer PLT is improved by the openings OP. Since the fifth adhesive layer AL5 is not disposed in the region corresponding to the folding region FA0, the flexibility of the support layer PLT may be improved.

A sixth adhesive layer AL6 and the cover member SCV are disposed below the support layer PLT. Hereinafter, in this specification, the sixth adhesive layer AL6 may be referred to as a lower adhesive layer.

The cover member SCV may be manufactured in a sheet form and attached to the support layer PLT. The cover member SCV may have a lower elastic modulus than the support layer PLT. In an embodiment, for example, the cover member SCV may include at least one of thermoplastic polyurethane (TPU), rubber, or silicone. Although not illustrated, the cover member SCV may be attached under the support layer PLT by a separate additional adhesive layer.

The lower adhesive layer AL6 may be disposed under the support layer PLT to attach the support layer PLT and the digitizer DTM. The lower adhesive layer AL6 may include a first lower adhesive layer AL6-1 disposed under the first support portion PLT-1 and a second lower adhesive layer AL6-2 disposed under the second support portion PLT-2.

The digitizer DTM, which is also called an electromagnetic radiation (EMR) sensing panel, includes a plurality of loop coils that generate a magnetic field of a preset resonant frequency with an electronic pen. The magnetic field formed from the loop coils is applied to an LC resonance circuit composed of an inductor (coil) and a capacitor of the electronic pen. The coil generates an electric current using the received magnetic field, and transmits the generated electric current to the capacitor. Thus, the capacitor charges the electric current input from the coils and discharges the charged electric current to the coils. As a result, the magnetic field of a resonance frequency is discharged to the coil. The magnetic field discharged by the electronic pen may be re-absorbed by the loop coils of the digitizer. This makes it possible to determine which position of the electronic pen is adjacent to a touch screen.

The digitizer DTM may include a first digitizer DTM-1 attached under the first lower adhesive layer AL6-1 and a second digitizer DTM-2 attached under the second lower adhesive layer AL6-2. The first digitizer DTM-1 and the second digitizer DTM-2 may be disposed to be spaced apart from each other with a gap therebetween. The gap may be about 0.3 mm to about 3 mm. In an embodiment, the gap may be about 0.4 mm to about 2 mm. The gap may be defined to correspond to the folding region FA0. In an embodiment, the digitizer DTM may be omitted.

An electromagnetic shielding layer EMS may be disposed under the digitizer DTM. The electromagnetic shielding layer EMS may be added to block electromagnetic waves generated within the display device DD from affecting the digitizer DTM as a noise. The electromagnetic shielding layer EMS may include a first electromagnetic shielding layer EMS1 and a second electromagnetic shielding layer EMS2 respectively corresponding to the first digitizer DTM-1 and the second digitizer DTM-2. In this embodiment, the electromagnetic shielding layer EMS may be a copper sheet. The electromagnetic shielding layer EMS may include a magnetic metal powder (MMP) layer. The magnetic metal powder (MMP) layer may be directly formed on the lower surface of the digitizer DTM through a coating and curing process. In an embodiment, the electromagnetic shielding layer EMS may be omitted.

The seventh adhesive layer AL7 bonds the electromagnetic shielding layer EMS and the lower metal plate MP. The seventh adhesive layer AL7 may include a first portion AL7-1 and a second portion AL7-2 spaced apart from each other. The lower metal plate MP may include a first lower metal plate MP1 and a second lower metal plate MP2 respectively attached to the first portion AL7-1 and the second portion AL7-2. The lower metal plate MP may improve heat dissipation, and as illustrated in FIG. 6B, may protect the component above the lower metal plate MP from external pressure generated during the attachment process when the second panel protective layer PPL-2 is fixed after bending of the display device DD. The lower metal plate MP may include a material having an elastic modulus of about 60 gigapascals (GPa) or more, and may include a metal material such as stainless steel. In an embodiment, for example, the lower metal plate MP may include SUS 304.

The heat dissipation layer HRP may be disposed under the lower metal plate MP. The heat dissipation layer HRP may be a sheet having high thermal conductivity. The heat dissipation layer HRP may include a metal or a metal alloy, and for example, the heat dissipation layer HRP may include copper, a copper alloy, or graphite.

The heat dissipation layer HRP may include a first heat dissipation layer HRP1 and a second heat dissipation layer HRP2. The first heat dissipation layer HRP1 and the second heat dissipation layer HRP2 may be spaced apart from each other by a distance. A distance between the first heat dissipation layer HRP1 and the second heat dissipation layer HRP2 may be about 0.4 mm to about 2 mm, but is not particularly limited thereto. The distance between the first heat dissipation layer HRP1 and the second heat dissipation layer HRP2 may be disposed to correspond to the folding region FA0.

The magnetic field shielding sheet MSM may be disposed under the digitizer DTM. The magnetic field shielding sheet MSM may include a plurality of portions. At least some of the plurality of portions may have different thicknesses. The plurality of portions of the magnetic field shielding sheet MSM may be disposed to match a stepped portion of a bracket (not shown) disposed below the display device DD. In an embodiment, for example, the magnetic field shielding sheet MSM may be disposed under a portion of the digitizer DTM in which the electromagnetic shielding layer EMS is not disposed. In addition, the magnetic field shielding sheet MSM may be disposed, for example, under a portion of the lower metal plate MP in which the heat dissipation layer HRP is not disposed. The magnetic field shielding sheet MSM may have a structure in which a magnetic shielding layer and an adhesive layer are alternately stacked. The magnetic field shielding sheet MSM shields the magnetic field generated by the magnetic material (not shown) disposed therebelow. The magnetic field shielding sheet MSM may prevent the magnetic field generated from the magnetic material from interfering with the digitizer DTM. Although not illustrated, the printed circuit board PCB may be disposed on the magnetic field shielding sheet MSM.

Although not illustrated, the display device DD may further include a spacer overlapping the driving circuit DIC in a state in which the display panel DP is bent. The spacer may disperse heat generated from the driving circuit DIC during operation of the display device DD, thereby preventing deterioration.

A cover layer CVC may be disposed on the driving circuit DIC. The cover layer CVC may be provided in the form of a film and disposed on the display panel DP to cover the driving circuit DIC. The cover layer CVC may be disposed on the second region AA2. A portion of the cover layer CVC may be disposed on the shock absorbing layer DMP. The cover layer CVC may block the signal lines of the driving circuit DIC and the display panel DP from being exposed to the outside, thereby preventing the driving circuit DIC and the signal lines from being damaged due to moisture, oxygen, and the like. In addition, the cover layer CVC may prevent an external impact from being applied to the driving circuit DIC in a subsequent process.

A protective pattern PL-R may be disposed between the cover layer CVC and the shock absorbing layer DMP. The protective pattern PL-R may be a portion of a protective film PL (FIG. 7B) for protecting the shock absorbing layer DMP which remains without being removed during the manufacturing process of the display device DD. In an embodiment, for example, the protective pattern PL-R may include polyimide, polycarbonate, polyamide, triacetylcellulose, or polymethylmethacrylate, or polyethylene terephthalate. The protective pattern PL-R may have a thickness of about 10 μm to about 100 μm.

FIGS. 7A to 7E are diagrams illustrating embodiments of operations in a method of manufacturing (or providing) a display device DD. FIGS. 7A to 7E illustrate, in the manufacturing operations of the display device DD illustrated in FIG. 6A, forming a shock absorbing layer DMP on the display panel DP and forming a cover layer CVC which is partially disposed on the shock absorbing layer DMP.

Figure 7A:
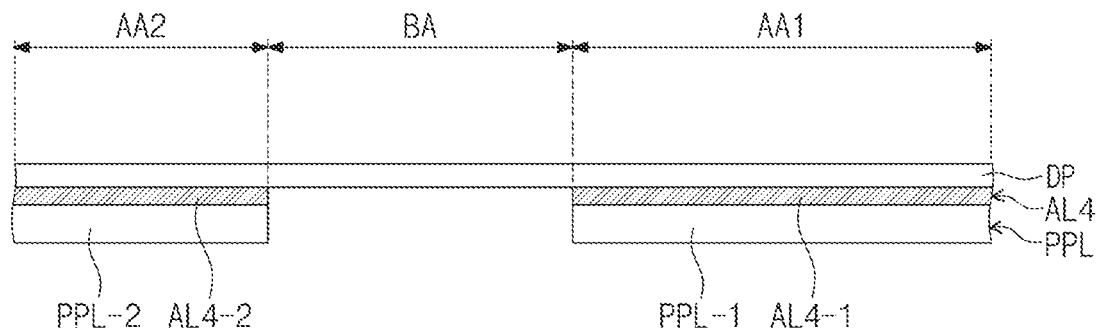
FIGS. 7A to 7E are diagrams illustrating embodiments of processes in a method of providing a display device.
Figure 7B:
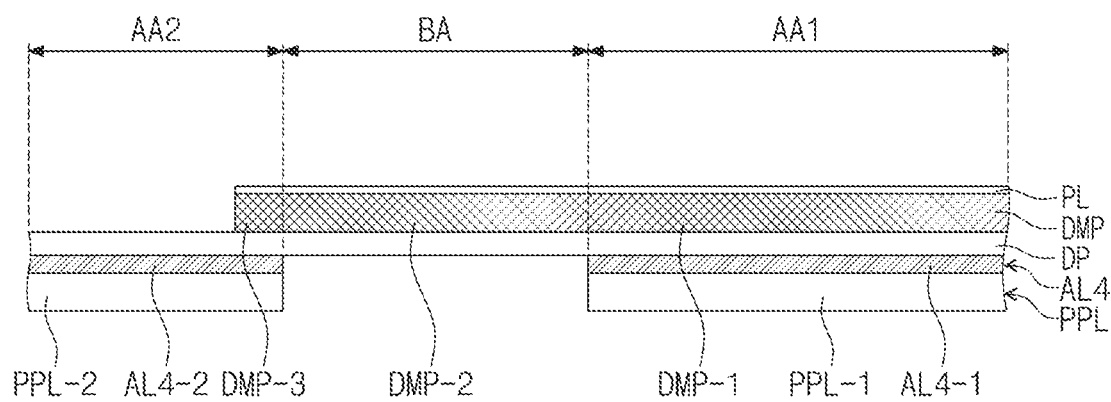

Referring to FIGS. 7A and 7B, in the method of manufacturing a display device DD, the display panel DP includes a first region AA1, a bending region BA, and a second region AA2, and a shock absorbing layer DMP is formed to overlap all of the first region AA1, the bending region BA, and the second region AA2 of the display panel DP. The shock absorbing layer DMP may include a polymer and have a low modulus to protect the display panel DP from external impact.

The shock absorbing layer DMP may be formed to overlap the entirety of the bending region BA and the first region AA1, and overlap a portion of the second region AA2. A portion of the display panel DP may be exposed outside of the shock absorbing layer DMP, to define an exposed portion of the display panel DP. The shock absorbing layer DMP may be formed (or provided) to include the first portion DMP-1 overlapping the first region AA1, the second portion DMP-2 overlapping the bending region BA, and the third portion DMP-3 overlapping the second region AA2. The first portion DMP-1, the second portion DMP-2, and the third portion DMP-3 may be formed through a same process. That is, the first portion DMP-1, the second portion DMP-2, and the third portion DMP-3 may be formed through a single process to have an integral shape.

In FIGS. 7A to 7E, the input sensor IS (FIG. 5) and the anti-reflection layer LF (FIG. 5) which are disposed in order from the display panel DP are omitted for convenience of the description, and the shock absorbing layer DMP is directly disposed on the display panel DP. However, the input sensor IS (FIG. 5) and the anti-reflection layer LF (FIG. 5) may be sequentially formed on the display panel DP, and the shock absorbing layer DMP may be formed on the anti-reflection layer LF. That is, the shock absorbing layer DMP may be an outermost layer of the display module DM, which is furthest from the display panel DP.

Referring again to FIGS. 7A and 7B, the method of manufacturing a display device DD includes forming a protective film PL as a preliminary protective layer, on the shock absorbing layer DMP. The protective film PL may be formed to fully overlap the shock absorbing layer DMP. The protective film PL may be configured to prevent damage to the shock absorbing layer DMP caused by heat or pressure applied to the shock absorbing layer DMP in a subsequent process. In an embodiment, for example, the protective film PL may include polyimide, polycarbonate, polyamide, triacetylcellulose, polymethylmethacrylate, or polyethylene terephthalate. The thickness of the protective film PL may be about 10 μm to about 100 μm. As the protective film PL fully overlaps the shock absorbing layer DMP, the protective film PL may be formed to overlap the entirety of the bending region BA and the first region AA1, and overlap a portion of the second region AA2.

Figure 7C:
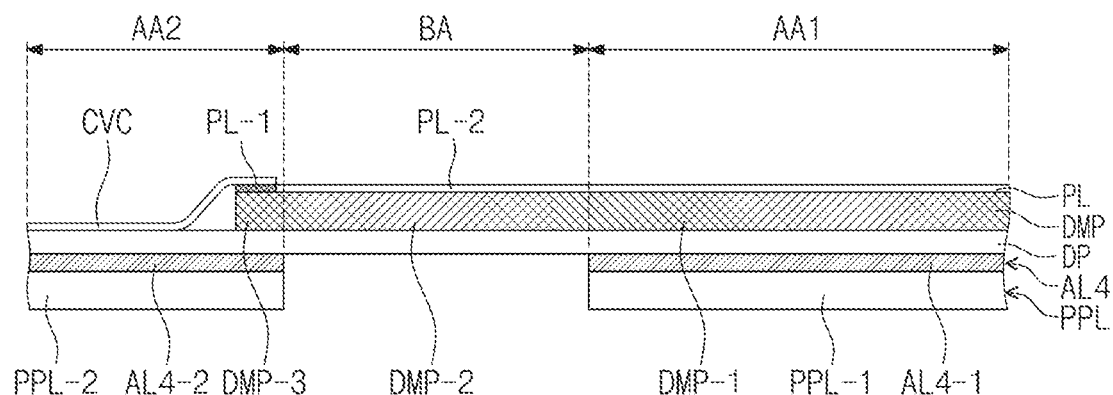

Referring to FIGS. 7B and 7C, the method of manufacturing a display device DD includes forming a cover layer CVC overlapping the driving circuit DIC (FIG. 6A) and having a portion disposed on the protective film PL. The cover layer CVC may cover the driving circuit DIC (FIG. 6A) to block the driving circuit DIC (FIG. 6A) from being exposed to outside. In addition, the cover layer CVC may have a shape extending from the driving circuit DIC (FIG. 6A) so that a portion thereof is disposed on the protective film PL, thereby blocking signal lines of the display panel DP from being exposed to outside. The cover layer CVC may be disposed to overlap the second region AA2 and may not overlap the bending region BA.

A portion of the cover layer CVC is disposed on the protective film PL, a portion of the protective film PL which overlaps the cover layer CVC may be referred to as a first protective portion PL-1, and a portion of the protective film PL which does not overlap the cover layer CVC may be referred to as a second protective portion PL-2. The first protective portion PL-1 may be a portion of the protective film PL which is furthest from the display region DP-DA (FIG. 3) In FIG. 7C, for convenience of the description, it is illustrated that the first protective portion PL-1 is distinguished from the second protective portion PL-2 by using different hatching. However, after the cover layer CVC is disposed, the first protective portion PL-1 and the second protective portion PL-2 may not be distinguished from each other and may have an integral shape.

Figure 7D:
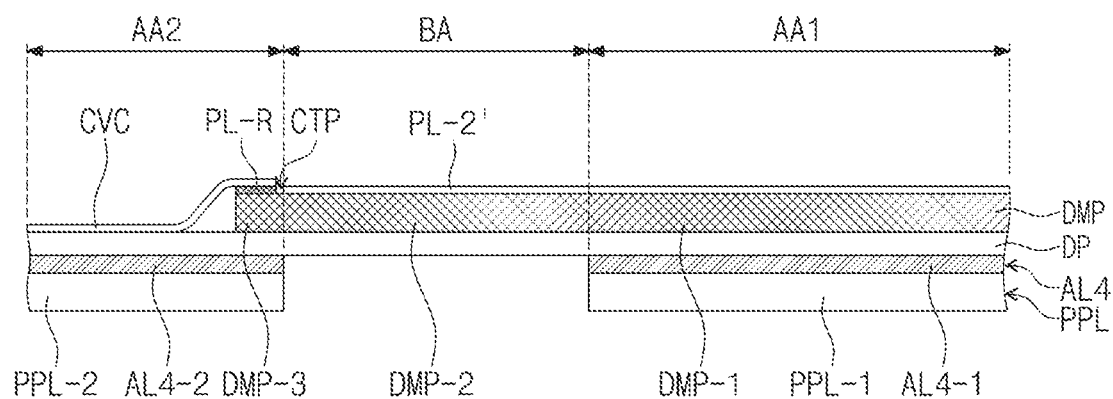

Referring to FIGS. 7C and 7D, the method of manufacturing the display device DD includes cutting a portion between the first protective portion PL-1 and the second protective portion PL-2 after disposing the cover layer CVC. The first protective portion PL-1 and the second protective portion PL-2 may be cut and separated from each other with a cut portion CTP therebetween. That is, the protective film PL is disconnected at a boundary between the bending region BA and the second region AA2, by the cut portion CTP.

In the method of manufacturing a display device DD, as a portion of the protective film PL between the first protective portion PL-1 and the second protective portion PL-2 is removed, the protective film PL is divided into a protective pattern PL-R and a remaining pattern PL-2'. An opening provided by the cut portion CTP may be defined between the protective pattern PL-R and the remaining pattern PL-2'. Accordingly, the remaining pattern PL-2' may be selectively removed from a remainder of the display module DM, in a subsequent process.

Figure 7E:
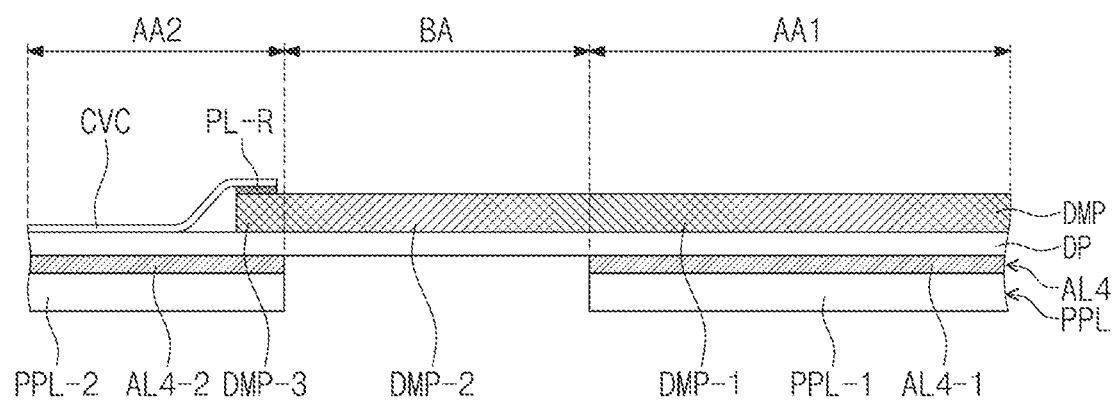

Referring to FIGS. 7D and 7E, the method of manufacturing the display device DD includes omission of a portion of a protective film PL between the first protective portion PL-1 and the second protective portion PL-2, and then removing the remaining pattern PL-2'.

In the above-described operation, since the portion of the protective film PL between the first and second protective portions PL-1 and PL-2 is omitted, the remaining pattern PL-2' may be selectively removed, and, in the process of removing the remaining pattern PL-2', the detachment, etc., of the first protective portion PL-1 may not occur. Accordingly, a defect such as separation of the cover layer CVC disposed on the first protective portion PL-1 may not occur. The first protective portion PL-1 remaining after the process of removing the second protective portion PL-2 may correspond to the above-described protective pattern PL-R.

According to one or more embodiment of the invention, it is possible to prevent cracks, etc., from occurring in a bending region BA of a display panel DP without forming a conventional bending protective layer through a separate resin in the bending region BA of the display panel DP.

Accordingly, the conventional bending protective layer forming process is omitted to simplify a process of providing a display module DM and reduce the width of a portion required for forming the bending protective layer, thereby reducing a dead space of the display device DD.

Although embodiments have been described, it is understood that the invention should not be limited to these embodiments but various changes and modifications can be made by one ordinary skilled in the art within the spirit and scope of the invention as hereinafter claimed.

What is claimed is:

1. An electronic device comprising:
    a display device comprising:
        a display panel including a first region including a display region, a second region, and a bending region which is between the first region and the second region and at which the display panel is bendable;
        an anti-reflection layer on the display panel and comprising a color filter; and
        a shock absorbing layer facing the display panel with the anti-reflection layer therebetween,
        wherein the shock absorbing layer corresponds to the first region of the display panel and extends from the first region to the bending region.

2. The electronic device of claim 1, wherein the shock absorbing layer comprises a polymer.

3. The electronic device of claim 1, wherein the shock absorbing layer has a thickness of about 50 micrometers to about 80 micrometers.

4. The electronic device of claim 1, further comprising a driving circuit in the second region of the display panel.

5. The electronic device of claim 4, further comprising a cover layer which covers the driving circuit in the second region and extends from the driving circuit to overlap the shock absorbing layer.

6. The electronic device of claim 5, further comprising a protective pattern between the cover layer and the shock absorbing layer.

7. The electronic device of claim 6, wherein the protective pattern which is between the cover layer and the shock absorbing layer, overlaps the second region of the display panel and does not overlap the bending region of the display panel.

8. The electronic device of claim 1, wherein the shock absorbing layer which extends from the first region of the display panel to the bending region thereof, further extends to the second region.

9. The electronic device of claim 1, wherein the shock absorbing layer which extends from the first region of the display panel to the bending region thereof comprises:
    a first portion corresponding to the first region;
    a second portion corresponding to the bending region; and
    the first portion and the second portion of the shock absorbing layer being integral with each other.

10. The electronic device of claim 9, wherein
    the bending region of the display panel is exposed outside of the anti-reflection layer comprising the color filter, and,
    the second portion of the shock absorbing layer contacts the bending region of the display panel which is exposed outside of the anti-reflection layer comprising the color filter.

11. The electronic device of claim 1, further comprising a window module facing the anti-reflection layer, with the shock absorbing layer therebetween,
    wherein
    the window module includes a window base layer and a window protective layer in order from the shock absorbing layer,
    each of the shock absorbing layer and the window protective layer has an elastic modulus, and
    the elastic modulus of the shock absorbing layer is lower than the elastic modulus of the window protective layer.

12. The electronic device of claim 1, wherein the first region of the display panel comprises:
    the display region including a pixel; and
    a non-display region adjacent to the display region.

13. The electronic device of claim 1, wherein the anti-reflection layer further comprises:
    the color filter provided in plural including a plurality of color filters, and
    a division layer between the plurality of color filters.

14. The electronic device of claim 1, further comprising an input sensor between the display panel and the anti-reflection layer.

* * * * *